United States Patent [19]
Fried et al.

[11] Patent Number: 5,512,784
[45] Date of Patent: Apr. 30, 1996

[54] SURGE PROTECTOR SEMICONDUCTOR SUBASSEMBLY FOR 3-LEAD TRANSISTOR AOTLINE PACKAGE

[75] Inventors: Robert L. Fried, Plainview; Enrico F. Napoletano, Flushing; Marie Guillot, St. James, all of N.Y.

[73] Assignee: Jerrold Communications, General Instrument Corporation, Hatboro, Pa.

[21] Appl. No.: 229,555

[22] Filed: Apr. 19, 1994

[51] Int. Cl.⁶ .................. H01L 29/861; H01L 23/34; H01L 23/495
[52] U.S. Cl. .................. 257/724; 257/666; 257/658; 257/723
[58] Field of Search .................. 257/723, 724, 257/666, 735, 658, 727; 361/111, 119, 127, 670, 806, 813, 772

[56] References Cited

U.S. PATENT DOCUMENTS

| | | | |
|---|---|---|---|
| 3,723,836 | 3/1973 | Shekerjian et al. | 257/724 |
| 4,218,694 | 8/1980 | Grzybowski | 357/76 |
| 4,408,248 | 10/1983 | Bulley et al. | 361/91 |
| 4,599,636 | 7/1986 | Roberts et al. | 257/724 |
| 4,796,150 | 1/1989 | Dickey et al. | 361/119 |
| 5,150,271 | 9/1992 | Unterweger et al. | 361/119 |
| 5,218,231 | 6/1993 | Kudo | 257/735 |
| 5,371,647 | 12/1994 | Fried et al. | 361/119 |

OTHER PUBLICATIONS

Jedec Publication #95 (see attached TO–220/TO–263).
Teccor Electronics, Inc.—General Catalog #111 pp. 73–77.

*Primary Examiner*—Sara W. Crane
*Assistant Examiner*—S. V. Clark
*Attorney, Agent, or Firm*—Marshall, O'Toole, Gerstein, Murray & Borun

[57] ABSTRACT

The subassembly of the present invention includes three pairs of aligned steering diodes and a single thyristor situated between spaced apart conductive heat sink plates. The subassembly is configured to fit into a standard 3-lead transistor outline package by arrangement of the semiconductors and shaping of the conductive plates. In one embodiment, the plates are square, and the components are arranged such that the diode pairs and thyristor are proximate the corners of the plates. In another embodiment, a "T" arrangement is utilized for the components which are situated between "H" shaped plates.

22 Claims, 7 Drawing Sheets

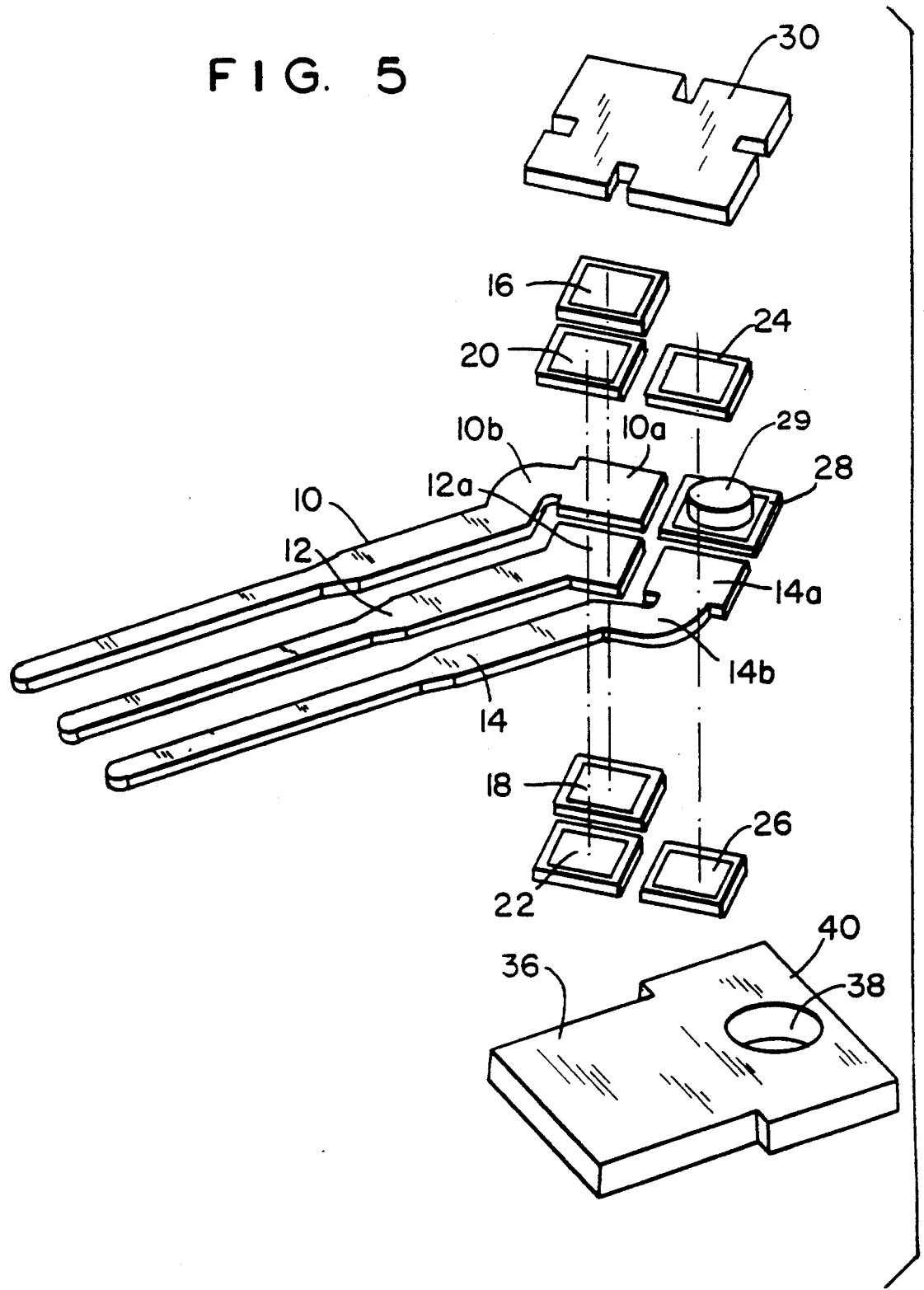

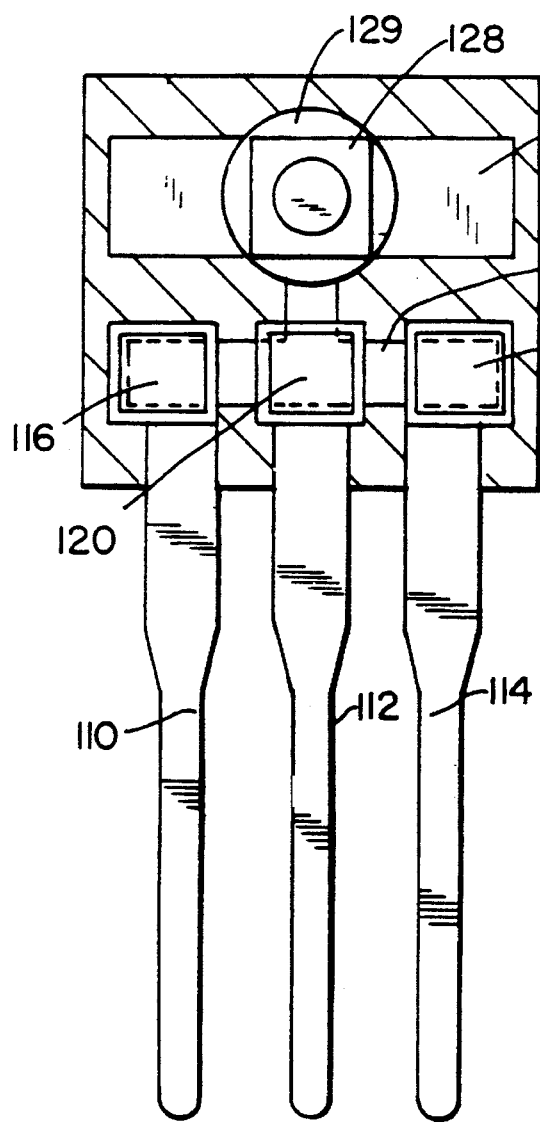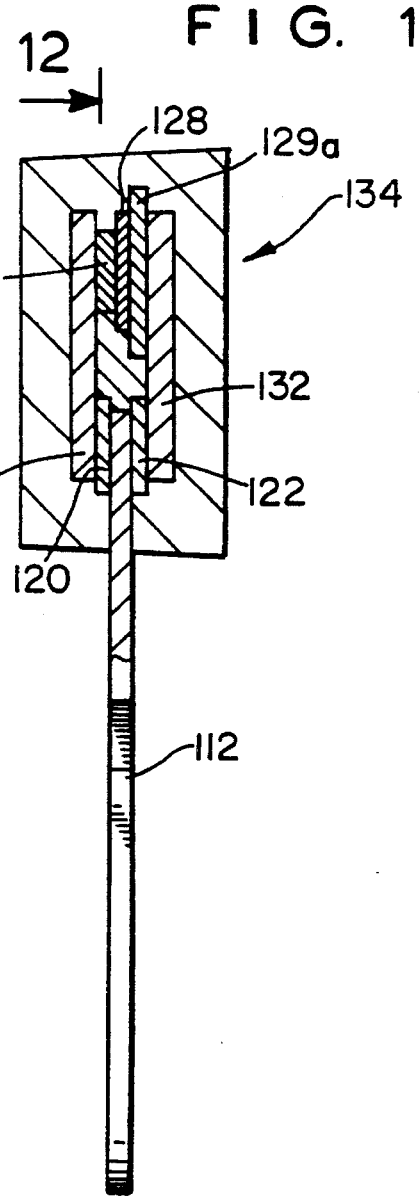

SURGE PROTECTOR SEMICONDUCTOR SUBASSEMBLY FOR 3-LEAD TRANSISTOR AOTLINE PACKAGE

TECHNICAL FIELD OF THE INVENTION

The present invention relates to semiconductor circuit modules designed for use in devices which protect telecommunication equipment and their users from power surges, and more particularly to a subassembly for such a module which employs six steering diodes and a single, unidirectional thyristor which are arranged in a novel pattern between uniquely shaped conductive plates to permit the subassembly to fit into a standard 3-lead "transistor outline" package.

BACKGROUND OF THE INVENTION

U.S. Pat. No. 4,796,150, which issued Jan. 3, 1989 to Dickey et al, discloses a mechanical-electrical device for protecting telecommunication equipment from power surges which may occur on the tip and/or ring conductors of attached transmission lines. The device disclosed by Dickey et al offers protection against surges in both tip and ring conductors by utilizing a plurality of semiconductor devices. Six of the semiconductor devices are diodes which function as rectifiers, permitting the passage of current in only one direction. These diodes are referred to as "steering" diodes for that reason. A seventh device is a chip containing both a Zener diode and a Silicon Controlled Rectifier (SCR) and is responsive to surges. This seventh device cooperates with the six steering diodes so that surges on the tip and/or ring conductors, regardless of polarity, are conducted to ground.

Dickey et al also discloses a packaging arrangement which includes a non-conductive housing with several mechanical parts. Openings are formed in the housing to receive the semiconductors and the metallic plates associated with the semiconductors. The metallic plates act as electrical connectors and heat dissipaters. The housing disclosed by Dickey et al has a complex structure, and the semiconductors and metallic plates must be mounted manually, one at a time, which greatly adds to the assembly time and overall cost of the protection device.

Another arrangement which offers protection against surges and which includes a plurality of semi-conductor devices is disclosed by Bulley in U.S. Pat. No. 4,408,248. The arrangement disclosed by Bulley offers protection against surges in both tip and ring conductors by utilizing six steering diodes and a seventh device in the form of a Silicon Controlled Rectifier (SCR) which is responsive to voltage and current sensing circuits.

Copending Patent Application Serial No. 07/917,778 filed Jul. 21, 1992 in the name of Muni Mitchell, Robert Fried, Lou Schilling, and Willem Einthoven entitled "Surge Protector Circuit Module and Method for Fabricating Same" (which is owned by the assignee hereof) teaches a unitary circuit module adapted to be installed as a single unit in a telecommunication protection device, and which overcomes the problems associated with the Dickey et al and Bulley type devices. It employs a unique lead frame permitting the modules to be fabricated using mass production techniques. As a result, the cost of the circuit itself is reduced, as is the cost of the construction and assembly of the surge protection device.

In the invention described in the above noted patent application, sets of steering diodes and an ungated thyristor are simultaneously formed into surge protection circuit subassemblies around spaced portions of an extended lead frame. The frame includes three spaced parallel leads for each module. The leads are connected along their exposed ends by a bridge. During assembly, the sets of semiconductor components are arranged along the lead frame in a soldering fixture. By heating, each lead is soldered between a pair of steering diodes, and the steering diodes on each side of the lead frame are soldered to different conductive plates. The thyristor is also soldered between the conductive plates. The components are arranged in a "T" formation. The conductive plates are correspondingly "T" shaped.

The above circuit module employs a single, unidirectional voltage limiting thyristor chip. It is possible to use a single unidirectional thyristor because the steering diodes direct the surge current through the thyristor in the same direction, no matter which two leads or polarities are involved. Use of a single unidirectional thyristor with six steering diodes is a significant advantage over a device with either two or three bidirectional thyristors.

Conventional telecommunication surge protectors which contain two or three thyristors are commonly provided in a 3-lead "transistor outline" (TO) package. This size package is required for certain applications. However, neither the two thyristor nor the three thyristor structure is truly balanced. That is, because surges across different lead combinations do not pass through the same voltage limiting device (thyristor), the voltage limiting between any two leads is not necessarily equal. This problem can be reduced by employing "matched" devices. However, using matched devices on the chip to achieve balance is prohibitively expensive, and no two devices are exactly alike.

The use of a single, unidirectional thyristor with six steering diodes, as set forth in the above patent application Ser. No. 07/917,778, eliminates the balancing problem in a cost effective manner. However, the subassembly taught in this application, for example, cannot be packaged to fit into "standard" transistor outline package because of the specific arrangement of components and of the shape of the conductive plates between which the components are situated.

In the present application, all references to "standard" 3-lead transistor outline packages relate to JEDEC registered TO-220 and TO-263 outlines and to the "A" package modified TO-220 (isolated) SIDACTOR® distributed by Teccor Electronics, Inc. of Irving, Tex.

SUMMARY OF THE INVENTION

It is, therefore, a prime object of the present invention to provide a mass producible semiconductor subassembly for a surge protector which employs a single unidirectional thyristor and which is configured to fit into a standard 3-lead transistor outline package, such as the JEDEC registered TO-220 and TO-263 outlines or the Teccor modified TO-220.

It is another object of the present invention to provide a low-cost, balanced surge protector semiconductor subassembly for a standard 3-lead transistor outline package.

It is another object of the present invention to provide a surge protector semiconductor subassembly for a standard 3-lead transistor outline package which employs a unique component arrangement and one or more square conductive plates which are interchangeable and easy to orient.

It is still another object of the present invention to provide a surge protector semiconductor subassembly adaptable for standard 3-lead transistor outline packages of the isolated or non-isolated type.

It is another object of the present invention to provide a surge protector semiconductor subassembly for a standard 3-lead transistor outline package which employs a unique component arrangement and utilizes one or more "H" shaped conductive plates.

In accordance with one aspect of the present invention, a semiconductor circuit module for a surge protector is provided. The module includes three pairs of aligned diodes and a single, unidirectional thyristor. These components are arranged in a substantially square pattern, and are situated between aligned conductive plates to form a subassembly. One of the plates has a substantially square configuration. Means are provided for encapsulating the subassembly in a non-conductive package having a standard 3-lead transistor outline configuration.

In one preferred embodiment, both of the plates have a substantially square configuration. In another preferred embodiment, one of the conductive plates has a standard header shape.

The square conductive plate has four corners. The diode pairs are situated proximate to three of the corners. The thyristor is situated proximate to the fourth corner. Preferably, notches are provided to facilitate alignment of the components during soldering. The package is a standard isolated 3-lead transistor type outline package. The package is approximately 3.97 cm by 3.61 cm by 1.80 cm. The plate has a side dimension of less than 3.61 cm.

Alternatively, the package may be a standard non-isolated 3-lead transistor outline package. Such a package is approximately 3.97 cm by 3.35 cm by 1.75 cm with the header being 5.798 cm by 3.97 cm. The plate has a side dimension of less than 3.35 cm.

In accordance with another aspect of the present invention, a semiconductor circuit module for a surge protector is provided. The module includes three pairs of aligned diodes and a single, unidirectional thyristor. These components are arranged, and are situated, between aligned conductive plates to form a subassemby. One of the plates is substantially "H" shaped. Means are provided for encapsulating the subassembly in a non-conductive package. The package has a 3-lead transistor outline configuration.

Preferably, both plates have substantially "H" shapes. The three pairs of aligned diode are colinearly arranged along one side of the "H" shaped conductive plates. The thyristor is situated along the other side of the "H" shaped conductive plates. Notches in the plates allow the components to be aligned during soldering.

In accordance with yet another aspect of the present invention, a semiconductor circuit module for a surge protector is provided. The surge protection module includes six steering diodes, wherein each of the six steering diodes has first and second sides. A first lead is soldered to the first side of a first of the six steering diodes and to the first side of a second of the six steering diodes, wherein the first and second of the six steering diodes are on opposing sides of the first lead. A second lead is soldered to the first side of a third of the six steering diodes and to the first side of a fourth of the six steering diodes, wherein the first and second of the six steering diodes are on opposing sides of the second lead. A third lead is soldered to the first side of a fifth of the six steering diodes and to the first side of a sixth of the six steering diodes, wherein the first and second of the six steering diodes are on opposing sides of the third lead. A first conductive plate is soldered to a second side of the first, third, and fifth of the six steering diodes. A second conductive plate is soldered to a second side of the second, fourth, and sixth of the six steering diodes. A single thyristor is soldered between the first and second conductive plates. The six steering diodes, the first and second conductive plates, and the single thyristor are encapsulated in a package so that ends of the first, second and third leads extend outside of the package and so that the package has a typical 3-lead transistor outline configuration.

Preferably, the first and second conductive plates are substantially square, the first and second of the six steering diodes are located between first corners of the first and second conductive plates, the third and fourth of the six steering diodes are located between second corners of the first and second conductive plates, the fifth and sixth of the steering diodes are located between third corners of the first and second conductive plates, and the single thyristor is located between fourth corners of the first and second conductive plates.

Alternatively, the first and second conductive plates are "H" shaped and have first and second sides, the first and second of the six steering diodes are located between the first sides of the first and second conductive plates, the third and fourth of the six steering diodes are located between the first sides of the first and second conductive plates, the fifth and sixth of the six steering diodes are located between the first sides of the first and second plates, and the single thyristor is located between the second sides of the first and second conductive plates. The second sides of the first and second conductive plates may be wider than the first sides of the first and second conductive plates.

BRIEF DESCRIPTION OF THE DRAWING

These and other features and advantages will become more apparent from a detailed consideration of the invention when taken in conjunction with the drawing in which like numerals refer to like parts and in which:

FIG. 5 is an exploded isometric view of a non-isolated version of an embodiment of a subassembly of the present invention;

FIG. 11 is a cross-sectional view of the module of FIG. 10 taken along line 11—11 of FIG. 10; and, FIG. 12 is a cross-sectional view of the module of FIG. 10 taken along line 12—12 of FIG. 11.

DETAILED DESCRIPTION OF THE PREFERRED EMBODIMENT

Figure 1:
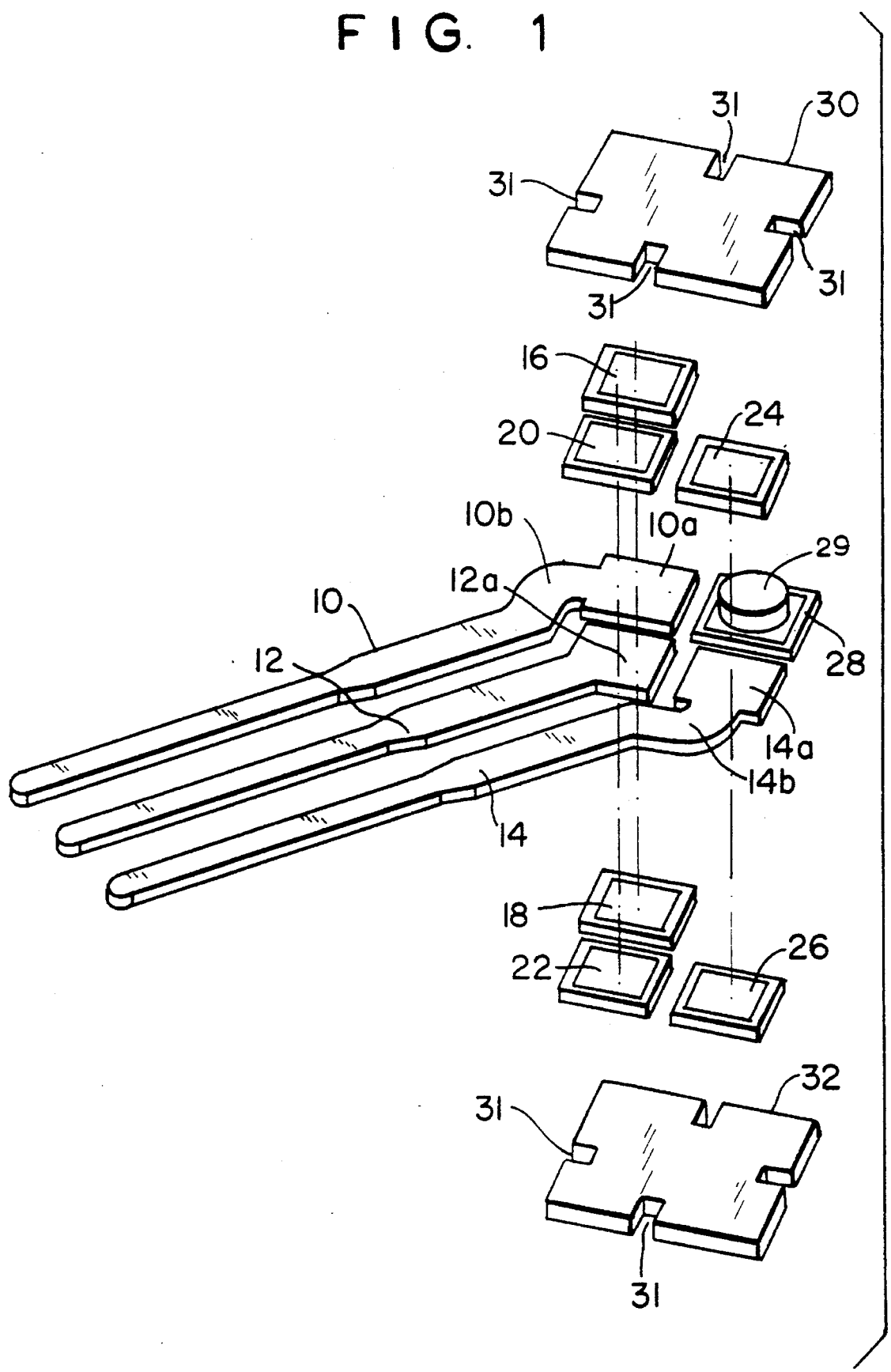
FIG. 1 is an exploded isometric view of an isolated version of a first preferred embodiment of a subassembly of the present invention.

As shown in FIG. 1, a subassembly is illustrated in accordance with a first preferred embodiment of the invention. This subassembly is designed for use in the package illustrated in FIG. 2, which has a typical isolated 3-lead transistor outline configuration. The subassembly includes three conductive leads 10, 12, and 14 to which the ring, tip, and ground terminals of a telecommunication line may be connected. The conductive leads 10, 12, and 14 may be supplied on an extended lead frame connected along exposed ends of the conductive leads 10, 12, and 14 by a bridge (not shown) for purposes of automating the assembly operations. The bridge is removed after the components are encapsulated.

Each conductive lead has a corresponding portion 10a, 12a, and 14a which are substantially square in shape in accordance with the shape of typical diode chips 16–26. The outside conductive leads 10 and 14 have corresponding arcuate neck portions 10b and 14b to permit the square portions 10a and 14a to be situated closely together. Each of the diode chips 16, 20, and 24 is soldered to the top of a corresponding lead portion 10a, 12a, and 14a, and each of the diode chips 18, 22, and 26 is soldered to the bottom of a corresponding lead portion 10a, 12a, and 14a to form three pairs of aligned diode. Thus, the aligned diode chips 16 and 18 are situated adjacent the conductive lead 10, the aligned diode chips 20 and 22 are situated adjacent the conductive lead 12, and the aligned diode chips 24 and 26 are situated adjacent the conductive lead 14.

A single, unidirectional thyristor chip 28 and a round conductive spacer or slug 29 are also provided. The diode chips 16, 18, 20, 22, 24, and 26, the thyristor chip 28, and the spacer 29, are soldered between a pair of spaced apart conductive plates 30 and 32 to form the subassembly. Accordingly, the diode chips 16, 20, and 24, and the spacer 29, are soldered to the conductive plate 30; and, the diode chips 18, 22, and 26, and the thyristor chip 28, are soldered to the conductive plate 32. The conductive plates 30 and 32 act as heat sinks as well as electrical connections. Notches 31 in each of the conductive plates 30 and 32 facilitate alignment of the chips 16–28 during soldering of the components.

In this embodiment, the conductive plates 30 and 32 are substantially square. The diode pairs 16/18, 20/22, and 24/26, are arranged proximate to three of the corners of the square defined by the conductive plates 30 and 32. The thyristor chip 28 is situated proximate the fourth corner of this square.

Figure 2:
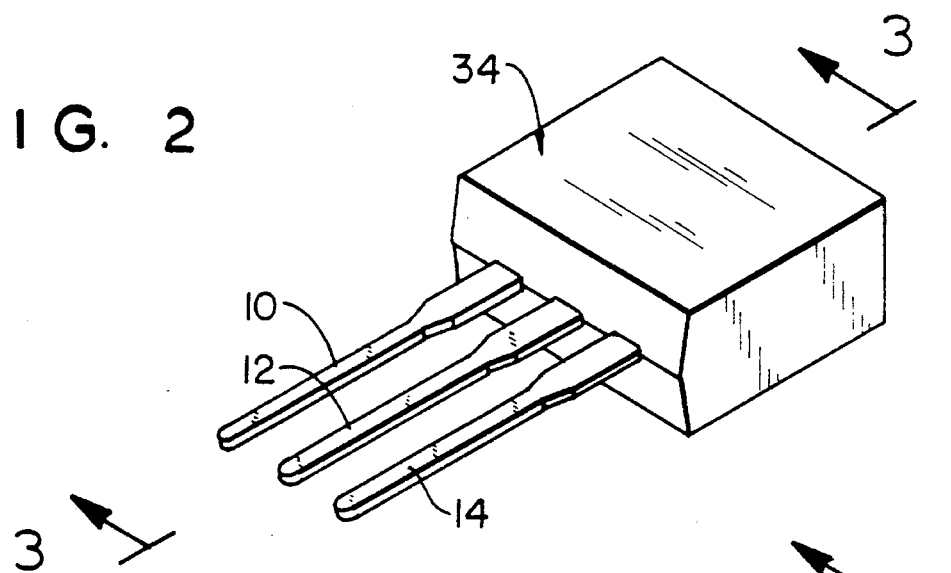
FIG. 2 is an isometric view of a module incorporating the subassembly of FIG. 1.
Figure 6:
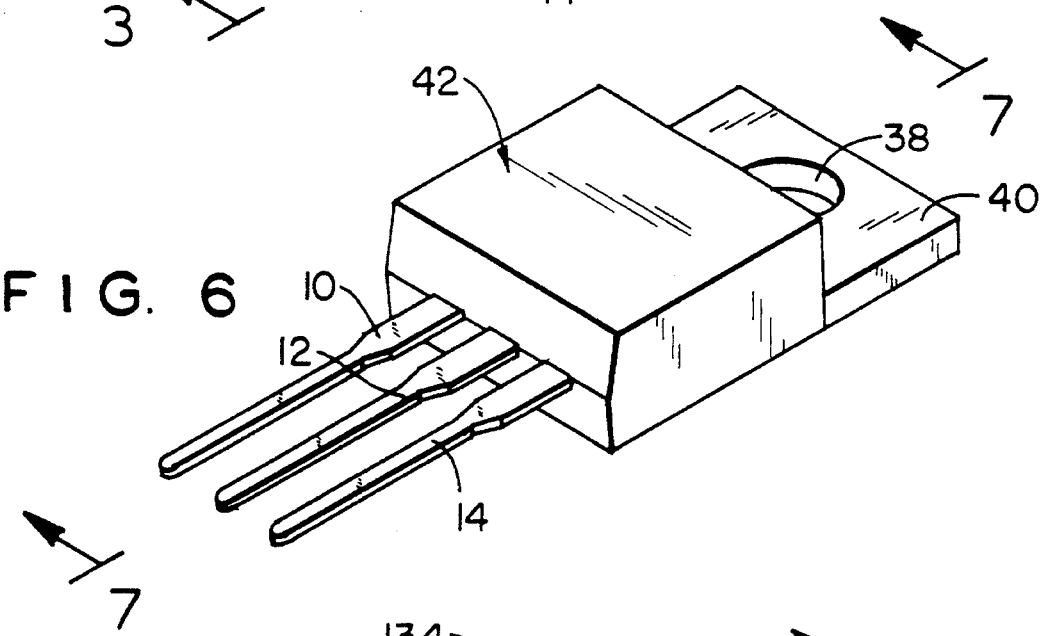
FIG. 6 is an isometric view of a module incorporating the subassembly of FIG. 5.
Figure 4:
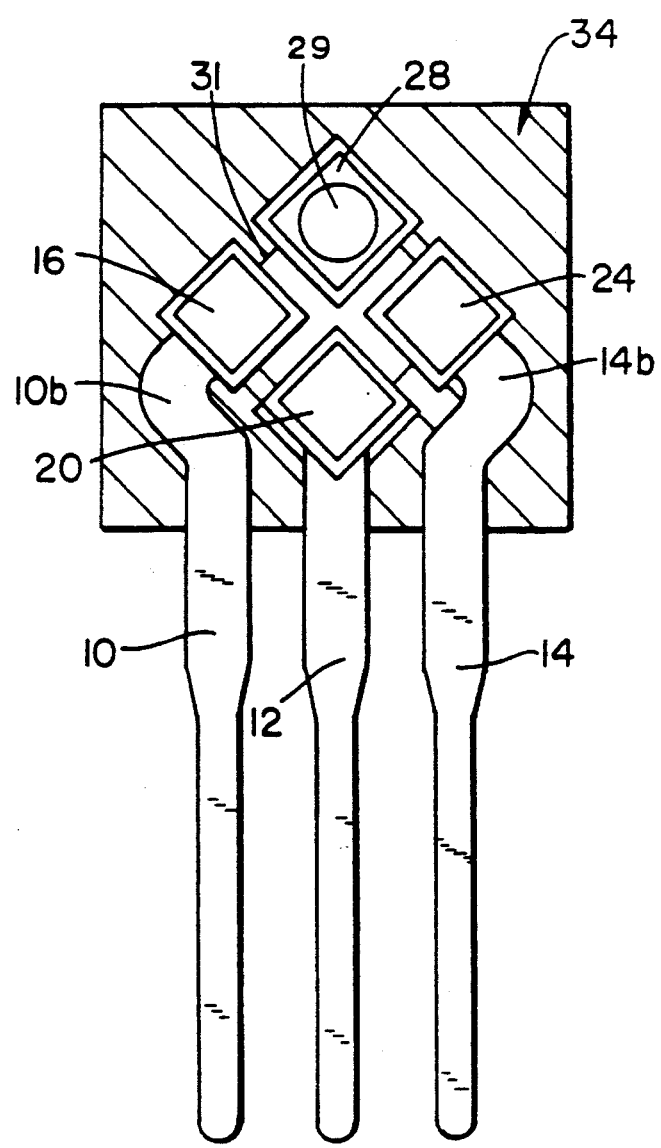
FIG. 4 is a cross-sectional view of the module of FIG. 2 taken along line 4—4 of FIG. 3.
Figure 3:
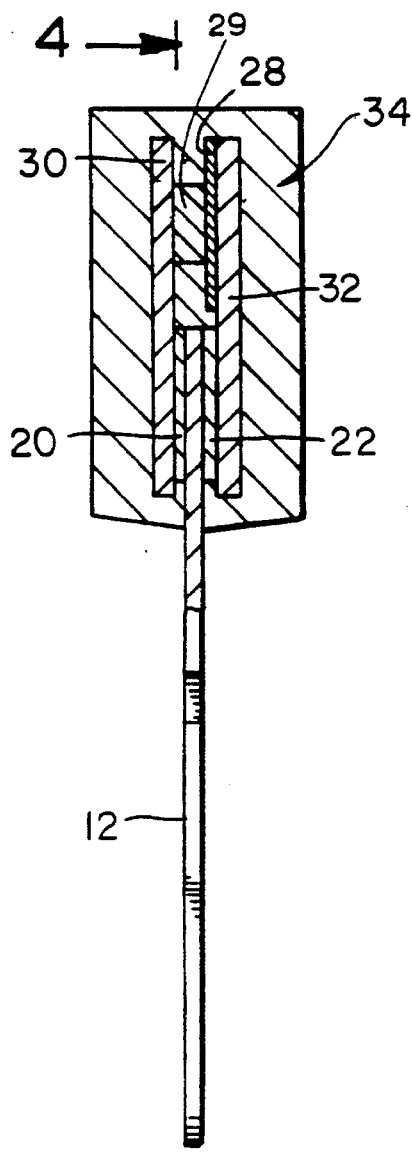
FIG. 3 is a cross-sectional view of the module of FIG. 2 taken along line 3—3 of FIG. 2.
Figure 8:
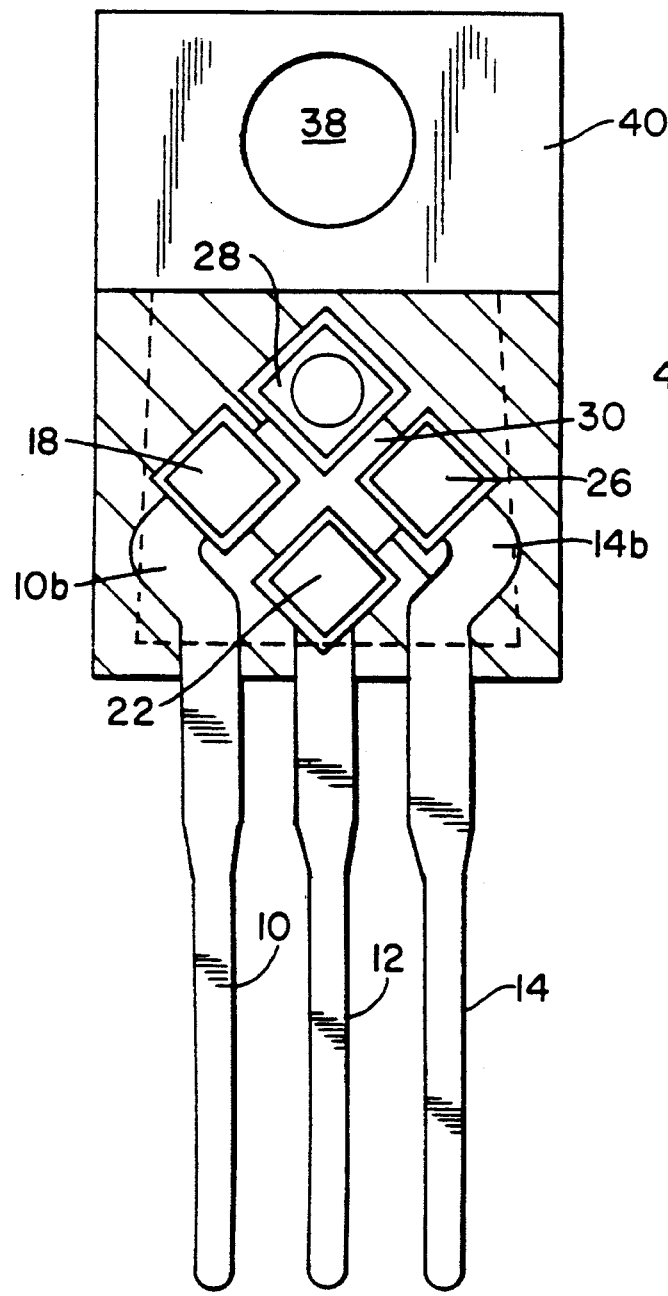
FIG. 8 is a cross-sectional view of the module of FIG. 6 taken along line 8—8 of FIG. 7.
Figure 7:
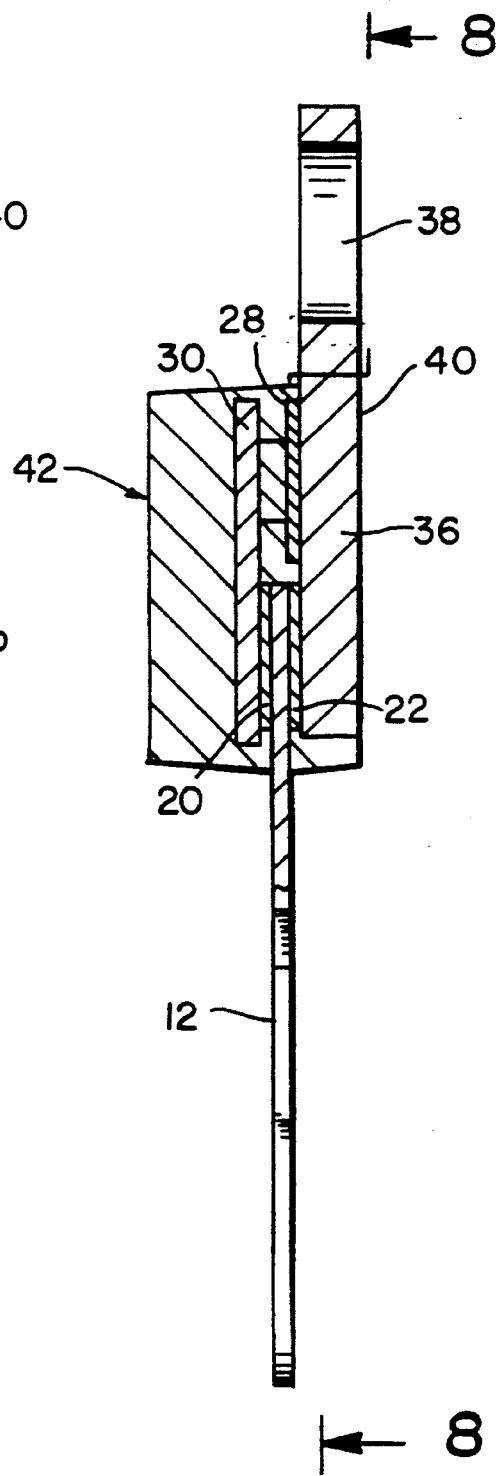
FIG. 7 is a cross-sectional view of the module of FIG. 6 taken along line 7—7 of FIG. 6.
Figure 9:
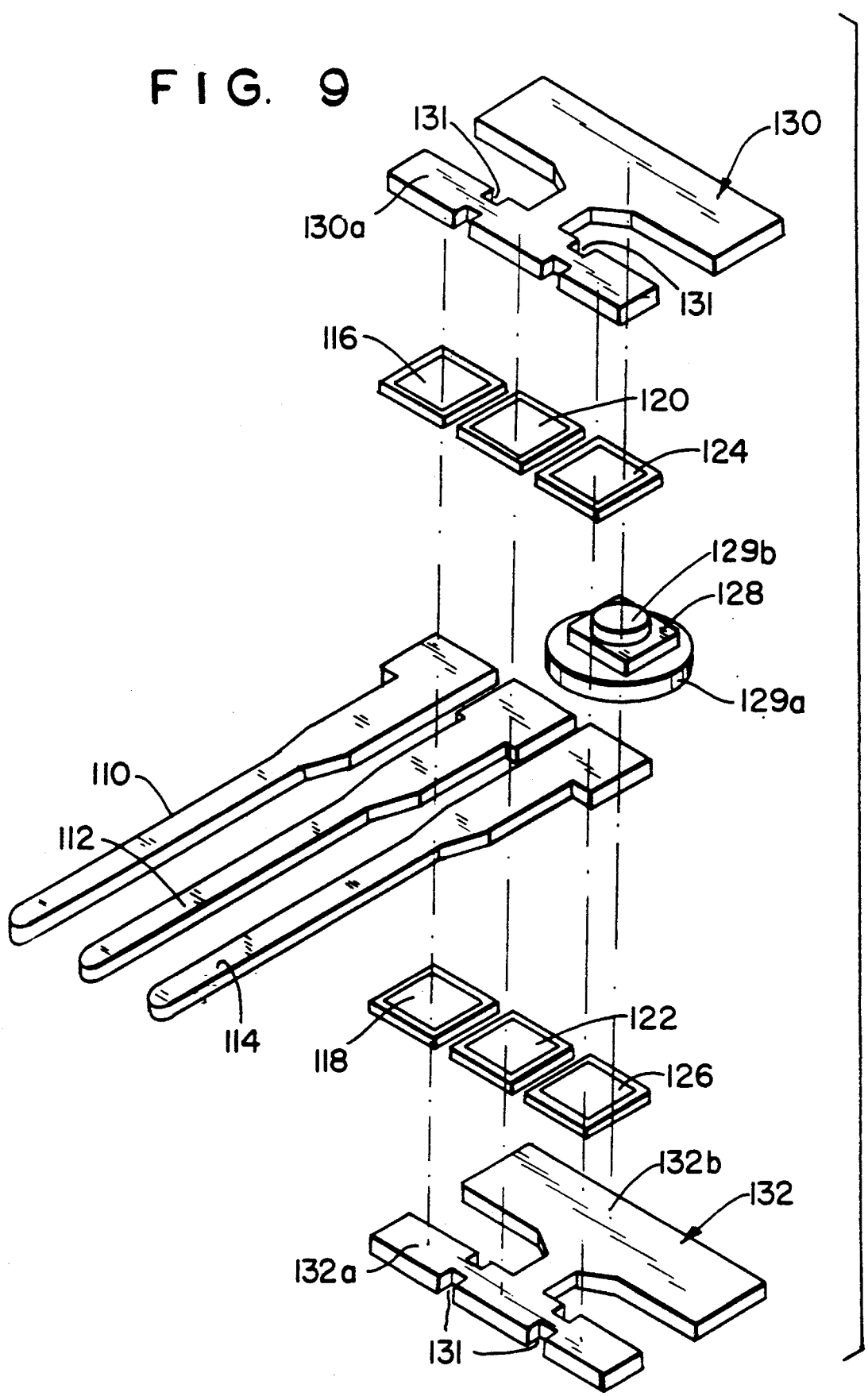
FIG. 9 is an exploded isometric view of another preferred embodiment of a subassembly of the present invention.

FIGS. 2, 3, and 4 illustrate the module containing the subassembly of FIG. 1. The subassembly of FIG. 1 is encapsulated in epoxy to form an isolated package 34 having a standard 3-lead transistor outline configuration. The epoxy illustrated is of the type which is molded around the subassembly. However, a premolded plastic snap-on case may also be used.

The isolated package 34 is preferably 3.97 cm by 3.61 cm by 1.80 cm. The conductive leads 10, 12, and 14 are 1 cm center line to center line and 0.32 cm in width, along the narrow sections thereof. The conductive leads 10, 12, and 14 are 0.015 cm thick. Each side of the diode chips 16, 18, 20, 22, 24, and 26 is 0.91 cm, and each side of the thyristor chip 28 is 1.0 cm.

FIGS. 5–8, illustrate a subassembly designed for use in a non-isolated package version of the invention. The subassembly of FIG. 5 is similar to the subassembly of FIGS. 1–4, and is encapsulated in a non-isolated package 42. However, the conductive plate 32 is replaced by a standard rectangular shaped conductive header 36 which has a circular opening 38 in an extended portion 40 thereof. The circular opening 38 in the header 36 permits the package 42 shown in FIGS. 5–8 to be screwed onto an external plate for specific applications. Also, the non-isolated package 42 is preferably 3.97 cm by 3.35 cm by 1.75 cm. The header 36 is preferably 5.798 cm by 3.97 cm and has a side dimension of less than 3.35 cm.

As in the case of the packaging arrangement illustrated in FIGS. 1–4, the package arrangement illustrated in FIGS. 5–8 may have a snap-on case instead of a molded case.

FIGS. 9–12, illustrate another preferred embodiment which employs a subassembly with a somewhat different component arrangement and differently shaped conductive plates. In this embodiment, conductive leads 110, 112, and 114 are all straight (no arcuate portions), and diode pairs 116/118 and 120/122 and 124/126 are arranged in a colinear fashion with each of the conductive leads 110, 112, and 114 being soldered between a corresponding diode pair. A thyristor chip 128 is sandwiched between a larger slug 129a and a smaller slug 129b. Conductive plates 130 and 132 are each substantially "H" shaped and have corresponding sides 130a, 132a, 130b, and 132b.

The sides 130a and 132a of the "H" shaped conductive plates 130 and 132 are aligned with the diode chips and are narrower than the sides 130b and 132b of the "H" shaped conductive plates 130 and 132. The sides 130b and 132b of the "H" shaped conductive plates 130 and 132 are aligned with the thyristor chip 128. Alignment notches 131 are provided in each side 130a and 132a.

The diode 116 may be soldered to the side 130a of the conductive plate 130, the diode 118 may be soldered to the side 132a of the conductive plate 132, the diode 120 may be soldered to the side 130a of the conductive plate 130, the diode 122 may be soldered to the side 132a of the conductive plate 132, the diode 124 may be soldered to the side 130a of the conductive plate 130, and the diode 126 may be soldered to the side 132a of the conductive plate 132. The thyristor 128 may be soldered between the sides 130b and 132b of the conductive plates 130 and 132. The side 130b and/or the side 132b of the "H" shaped conductive plates 130 and 132 may provide a heat sink to heat produced by surges, for example.

Figure 10:
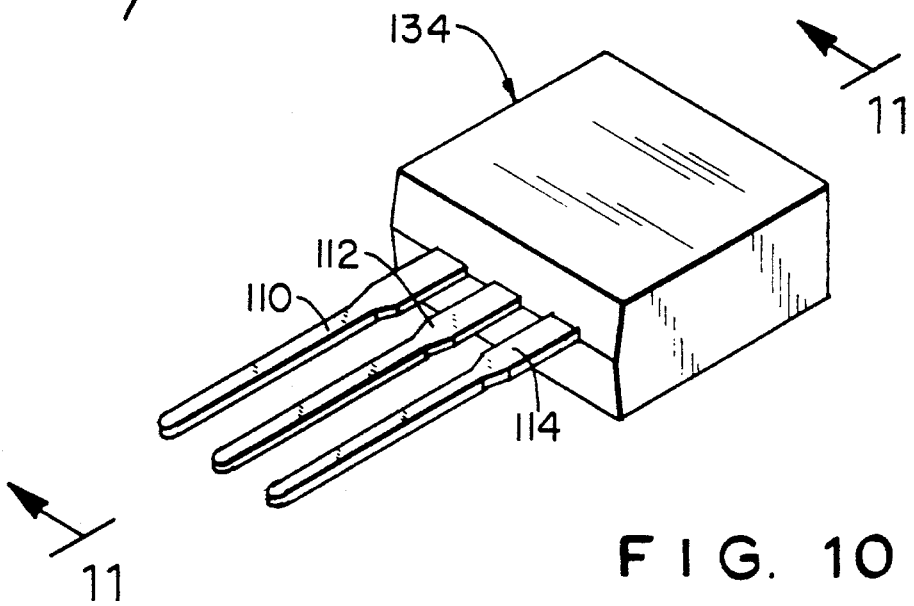
FIG. 10 is an isometric view of a module incorporating the subassembly of FIG. 9.

A package 134 is illustrated in FIGS. 10, 11, and 12, and is shown as formed of epoxy. The package is of the isolated type. Its dimensions are 3.97 cm by 3.60 cm by 1.80 cm. The diode chips are 0.95 cm square. The thyristor chip 128 is 1.04 cm square with a diagonal of 1.51 cm, approximately the same diagonal as the slug 129a. The package 134 may instead be a two part snap together case, as discussed above.

As should now be apparent, the present invention is a truly balanced subassembly which can be formed into a standard 3-lead transistor outline package for use as a telecommunication surge protector module. The square conductive plates of the first embodiments simplify assembly by being interchangeable and easy to orient, thereby reducing costs. The subassembly can fit into almost any transistor outline package larger than the TO-220 package with only slight modifications, such as substituting a header for one of the square plates or changing the lead configuration. Thus, inventory and the required number of different piece parts may be reduced. Moreover, the cost of the module with a single unidirectional thyristor plus six steering diodes is lower than with two or three matched bidirectional thyristor modules.

With regard to the second preferred embodiment incorporating "H" shaped conductive plates, although this embodiment employs less easily orientable plates, it has the other advantages of the previous embodiments. In addition, it permits the use of a more easily built soldering fixture, and provides better heat sink capabilities for a thyristor chip.

While only a limited number of preferred embodiments of the present invention have been disclosed for purposes of illustration, it is obvious that many variations and modifications could be made thereto. All of these variations and modifications fall into the scope of the present invention, as set forth in the following claims:

We claim:

1. A semiconductor circuit module for a surge protector comprising:

three pairs of aligned diodes and a single, unidirectional thyristor arranged in a substantially square pattern between aligned conductive plates to form a subassembly, wherein one of the conductive plates has a substantially square configuration; and, means for encapsulating the subassembly in a non-conductive package, wherein the package has a standard 3-lead transistor outline configuration.

2. The semiconductor circuit module of claim 1 wherein the one of the conductive plates has four corners, and wherein the diode pairs are situated proximate three of the four corners.

3. The semiconductor circuit module of claim 2 wherein the thyristor is situated proximate a fourth of the four corners.

4. The semiconductor circuit module of claim 1 wherein both of the conductive plates have a substantially square configuration.

5. The semiconductor circuit module of claim 4 wherein the package comprises a typical isolated 3-lead transistor outline package.

6. The semiconductor circuit module of claim 5 wherein the package is approximately 3.97 cm by 3.61 cm by 1.80 cm.

7. The semiconductor circuit module of claim 6 where each of the conductive plates has a side dimension of less than 3.61 cm.

8. The semiconductor circuit module of claim 1 wherein one of the conductive plates comprises a standard shaped header.

9. The semiconductor circuit module of claim 8 wherein the package comprises a standard non-isolated 3-lead transistor outline package.

10. The semiconductor circuit module of claim 9 wherein the package is approximately 3.97 cm by 3.35 cm by 1.75 cm with the header being 5.798 cm by 3.97 cm.

11. The semiconductor circuit module of claim 10 wherein the plate has a side dimension of less than 3.35 cm.

12. The semiconductor circuit module of claim 1 wherein the conductive plates further comprise alignment notches.

13. A semiconductor circuit module for a surge protector comprising:

three pairs of aligned diodes, and a single, unidirectional thyristor arranged between aligned conductive plates to form a subassembly, wherein one of the conductive plates is substantially "H" shaped; and, means for encapsulating the subassembly in a non-conductive package, wherein the package has a standard 3-lead transistor outline configuration.

14. The semiconductor circuit module of claim 13 wherein both of the conductive plates have substantially "H" shaped configurations.

15. The semiconductor circuit module of claim 13 wherein the "H" shaped conductive plate has first and second sides, and wherein the three pairs of aligned diodes are colinearly arranged along the first side of the "H" shaped conductive plate.

16. The semiconductor circuit module of claim 15 wherein the thyristor is situated along the second side of the "H" shaped conductive plate.

17. The semiconductor circuit module of claim 13 wherein the plates further comprise alignment notches.

18. The semiconductor circuit module of claim 13 wherein the package is approximately 3.97 cm by 3.60 cm by 1.80 cm.

19. A surge protection module comprising:

six steering diodes wherein each of the six steering diodes has first and second sides;

a first lead soldered to the first side of a first of the six steering diodes and to the first side of a second of the six steering diodes, wherein the first and second of the six diodes are on opposing sides of the first lead;

a second lead soldered to the first side of a third of the six steering diodes and to the first side of a fourth of the six steering diodes, wherein the first and second of the six diodes are on opposing sides of the second lead;

a third lead soldered to the first side of a fifth of the six steering diodes and to the first side of a sixth of the six steering diodes, wherein the first and second of the six diodes are on opposing sides of the third lead;

a first conductive plate soldered to a second side of the first, third, and fifth of the six steering diodes;

a second conductive plate soldered to a second side of the second, fourth, and sixth of the six steering diodes;

a single thyristor soldered between the first and second conductive plates; and, means for encapsulating the six steering diodes, the first and second conductive plates, and the single thyristor in a package so that ends of the first, second, and third leads extend outside of the package and so that the package has a typical 3-lead transistor outline configuration.

20. The surge protection module of claim 19 wherein the first and second conductive plates are substantially square, wherein the first and second of the six steering diodes are located between first corners of the first and second conductive plates, wherein the third and fourth of the six steering diodes are located between second corners of the first and second conductive plates, wherein the fifth and sixth of the steering diodes are located between third corners of the first and second conductive plates, and wherein the single thyristor is located between fourth corners of the first and second conductive plates.

21. The surge protection module of claim 19 wherein each of the first and second conductive plates is "H" shaped and has first and second sides, wherein the first and second of the six steering diodes are located between the first sides of the first and second conductive plates, wherein the third and fourth of the six steering diodes are located between the first sides of the first and second conductive plates, wherein the fifth and sixth of the six steering diodes are located between the first sides of the first and second plates, and wherein the single thyristor is located between the second sides of the first and second conductive plates.

22. The surge protection module of claim 21 wherein the second sides of the first and second conductive plates are wider than the first sides of the first and second conductive plates.

* * * * *

UNITED STATES PATENT AND TRADEMARK OFFICE
CERTIFICATE OF CORRECTION

PATENT NO. : 5,512,784
DATED : April 30, 1996
INVENTOR(S) : Robert L. Fried, Enrico F. Napoletano, and Marie Guillot It is certified that error appears in the above-indentified patent and that said Letters Patent is hereby corrected as shown below:

In the title item [54], and Column 1, line 3, "AOTLINE" should be --OUTLINE--.

Column 2, line 44, "SIDACTOR®" should be --SIDACTOR™--.

Signed and Sealed this

Twenty-third Day of July, 1996

Attest:

BRUCE LEHMAN

*Attesting Officer*   *Commissioner of Patents and Trademarks*